US006432731B1

(12) United States Patent
Kuroiwa

(10) Patent No.: US 6,432,731 B1
(45) Date of Patent: Aug. 13, 2002

(54) METHOD AND APPARATUS FOR VERIFYING SEMICONDUCTOR INTEGRATED CIRCUIT

(75) Inventor: Kunihiro Kuroiwa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/508,545

(22) PCT Filed: Jul. 9, 1999

(86) PCT No.: PCT/JP99/03728

§ 371 (c)(1),
(2), (4) Date: Jun. 8, 2000

(87) PCT Pub. No.: WO00/03338

PCT Pub. Date: Jan. 20, 2000

(30) Foreign Application Priority Data

Jul. 9, 1998 (JP) .......................................... 10-194850

(51) Int. Cl.[7] .......................... G06F 17/50; H01L 21/66
(52) U.S. Cl. .................................. 438/14; 716/5; 716/6
(58) Field of Search .......................... 438/14, 17; 716/1, 716/2, 4, 5, 6, 18; 324/600, 649

(56) References Cited

FOREIGN PATENT DOCUMENTS

| JP | 5-101131 | | 4/1993 |
| JP | 5-101131 A | * | 4/1993 |
| JP | 8-272839 | | 10/1996 |
| JP | 8-272839 A | * | 10/1996 |
| JP | 9-245065 | | 9/1997 |
| JP | 9-245065 A | * | 9/1997 |
| JP | WO 00/03338 | | 1/2000 |

OTHER PUBLICATIONS

Gray & Meyer, Analysis and Design of Analog Integrated Circuits, 1993, Third Edition, pp. 643–646.*
Gottlieb, Regulated Power Supplies, 1988, Howard Sams & Company, Third Edition, p. 222.*
Burns and Bond, Principles of Electronic Circuits, 1987, West Publishing, pp. 618 and 621.*
Gingrich, Web–site page, "Crrent Limiting and Slew Rate", 1999, http://www.phys.ualberta.ca/~gingrich/phys395/notes/node115.html, 1 page total.*
Fink and Christiansen, Electronics Engineer's Handbook, 1989, Third Edition, McGraw–Hill, 1 page 8–56.*

* cited by examiner

Primary Examiner—Michael J. Sherry
Assistant Examiner—Evan Pert
(74) Attorney, Agent, or Firm—Hogan & Hartson, L.L.P.

(57) ABSTRACT

A verification method is provided for verifying a semiconductor integrated circuit having a first logic macro-cell to be verified (101) and a plurality of second logic macro-cells (102–104) in which an output from the first logic macro-cell is inputted. The method sets a conversion slew rate $T_{max}$ that is a slew rate of a signal converted from a maximum allowable load of the first logic macro-cell. Input slew rates T1–T3 of signals that are inputted from the first logic macro-cell (101) to the second logic macro-cells (102–104) are obtained. The conversion slew rate $T_{max}$ is compared with each of the input slew rates T1–T3, and comparison results thereof are outputted. In this instance, an error is outputted when any one of the input slew rates T1–T3 exceeds the conversion slew rate $T_{max}$.

65 Claims, 12 Drawing Sheets

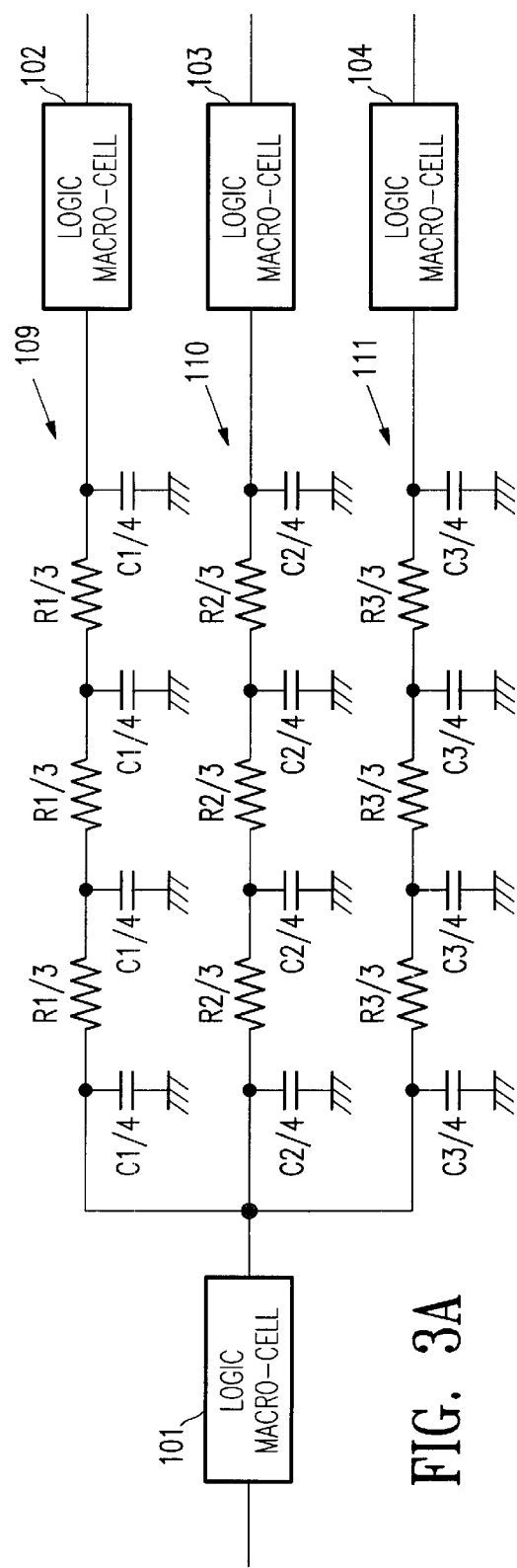
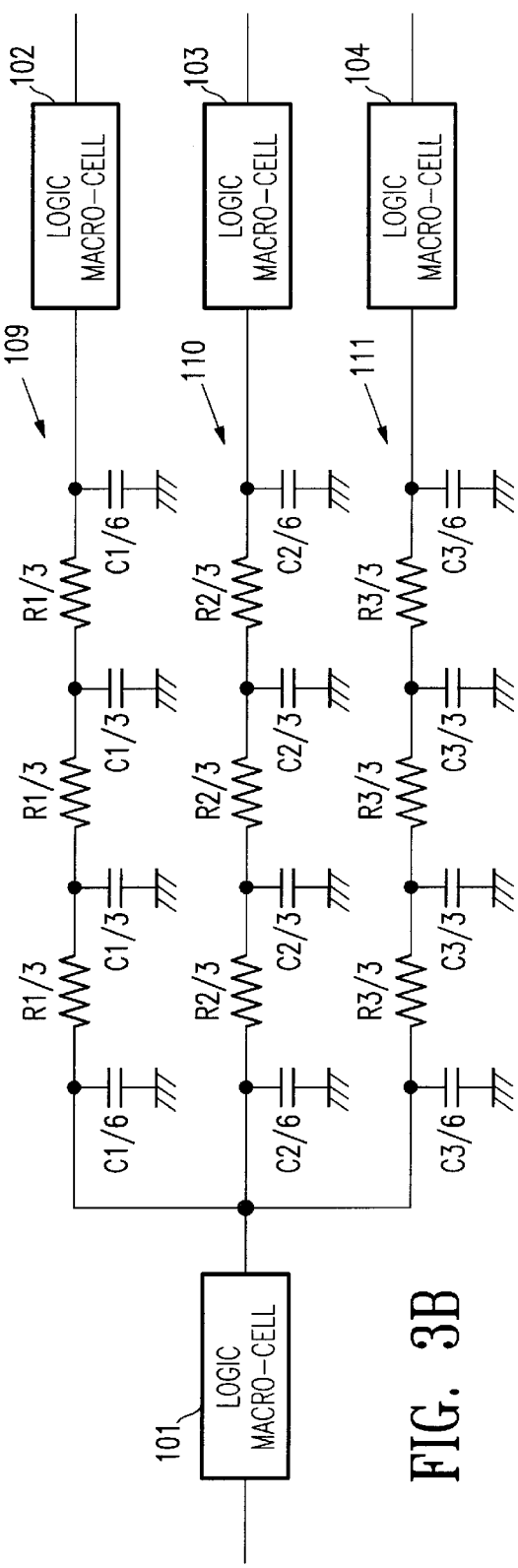
FIG. 3A
FIG. 3B

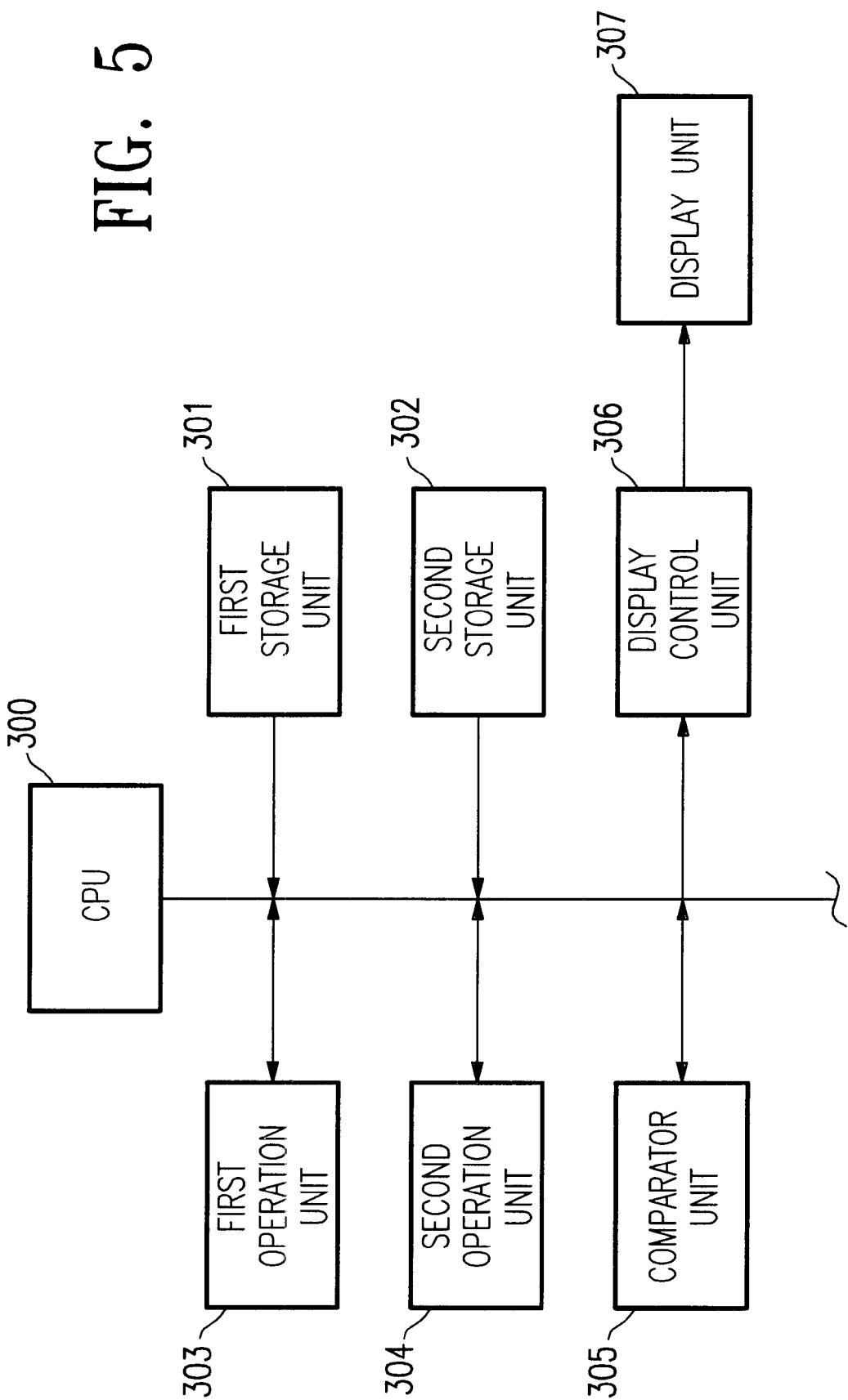

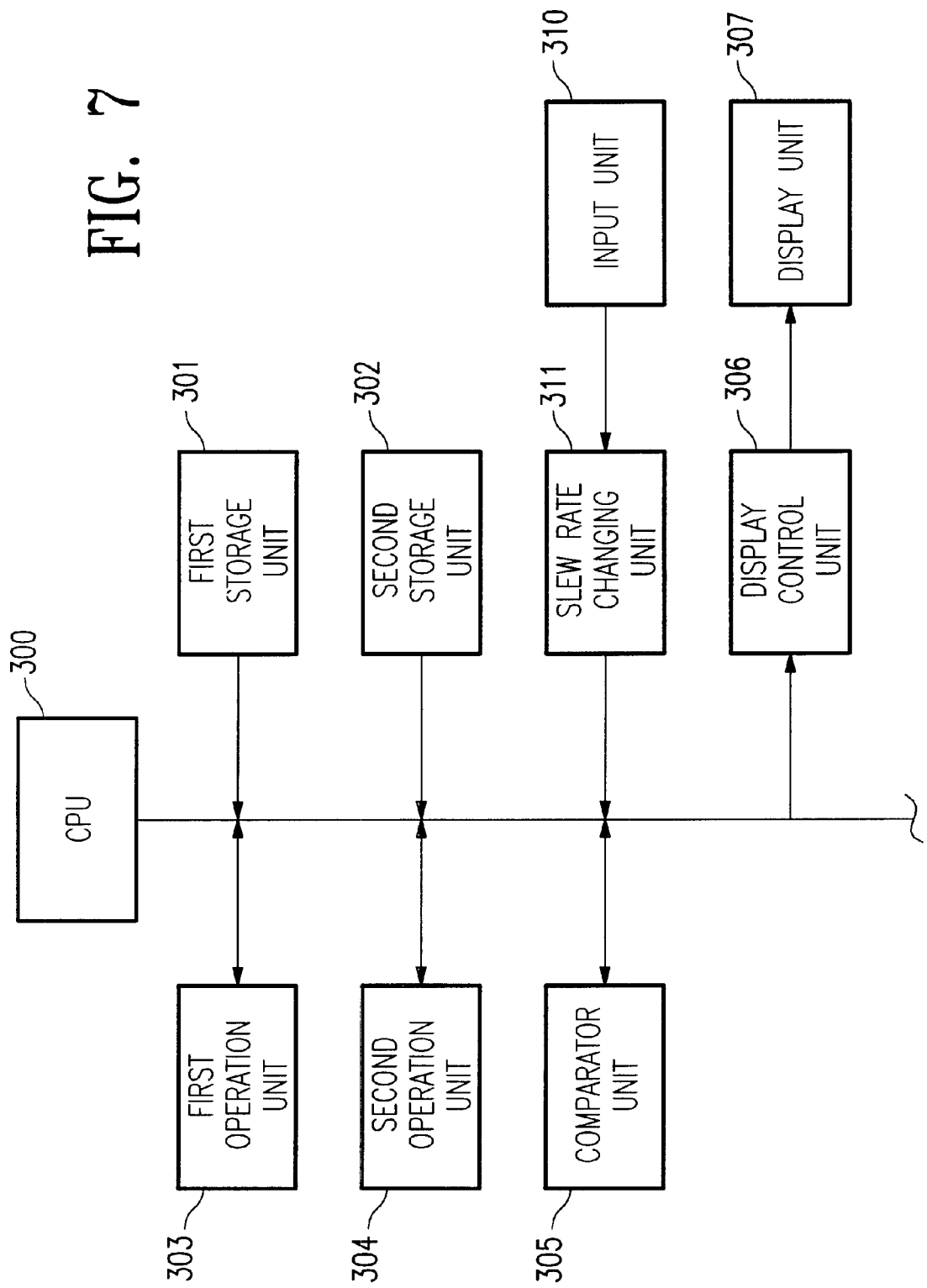

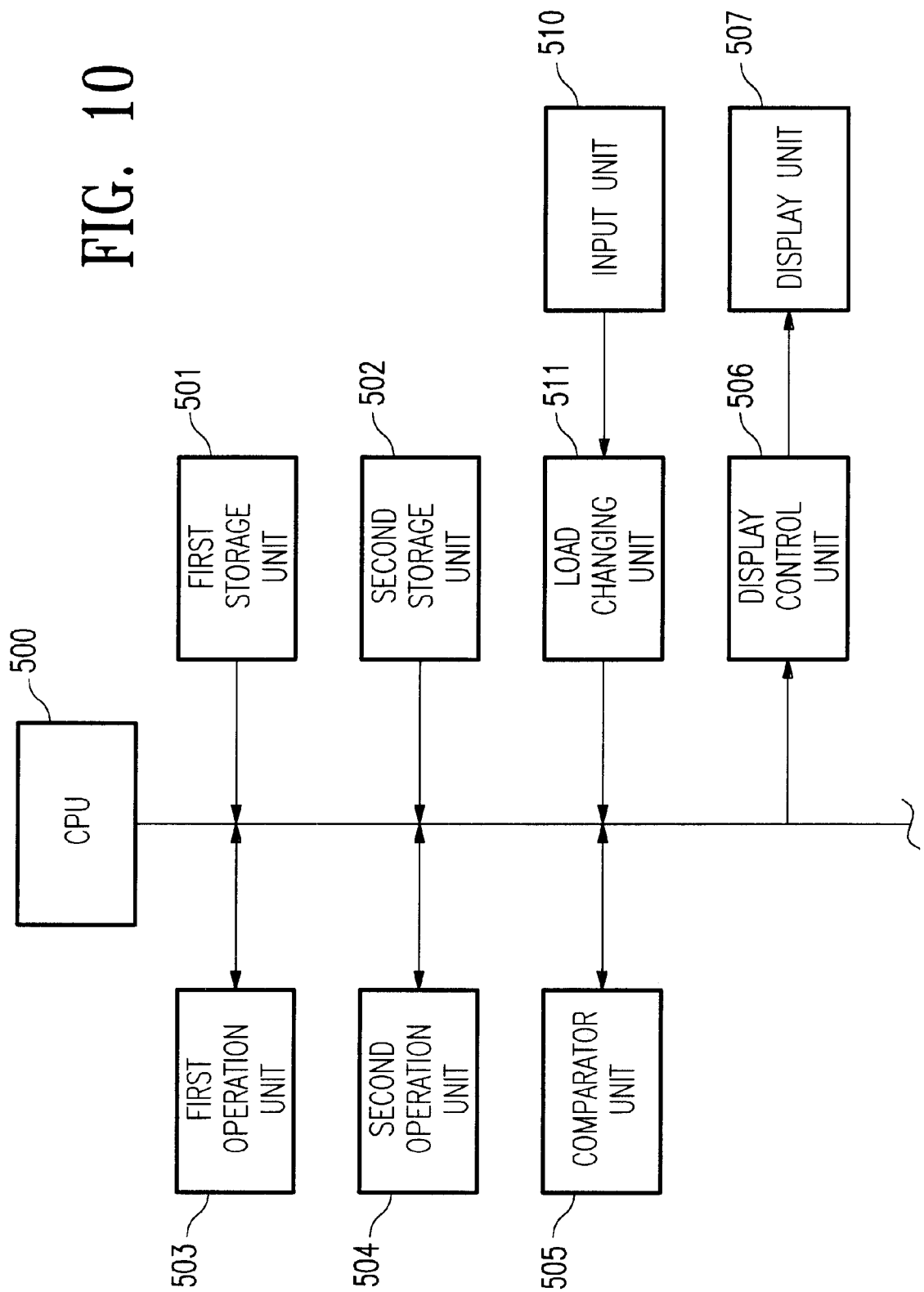

METHOD AND APPARATUS FOR VERIFYING SEMICONDUCTOR INTEGRATED CIRCUIT

FIELD OF THE INVENTION

The present invention relates to a method and apparatus for verifying the maximum allowable load of a logic macro-cell that is required to design a semiconductor integrated circuit.

TECHNOLOGICAL BACKGROUND

A semiconductor integrated circuit is typically composed of a plurality of logic macro-cells. A logic macro-cell refers to a function block that is formed from a combination of basic cells, such as CMOSs and the like. Logic macro-cells include those ranging from basic blocks, such as inverters, NANDs, NORs and the like to high performance blocks, such as flip-flops, counters, adders, decoders, multiplexers and the like. A semiconductor integrated circuit realizes required functions by inputting and outputting signals through the respective logic macro-cells.

To achieve a specified function, a signal that is inputted in a logic macro-cell in a preceding stage needs to be securely transmitted to a logic macro-cell in a succeeding stage such that the logic macro-cell in the succeeding stage operates with its normal function. Accordingly, the maximum allowable load of the logic macro-cell in the preceding stage needs to be verified.

Conventionally, the maximum allowable load of a preceding logic macro-cell is compared with an input capacitance load of a succeeding logic macro-cell, and an error indication is made when the latter exceeds the former.

In recent years, the miniaturization in manufacturing methods for manufacturing semiconductor integrated circuits and the larger scale integration of semiconductor integrated circuits are being progressed. Due to the miniaturized manufacturing process, the line width of wiring becomes thinner. Also, due to the larger scale integration of semiconductor integrated circuits, the number of logic macro-cells to be placed in a single chip increases and the length of wiring increases due to roundabout routing of the wirings. When the line width of wiring narrows and the line length thereof increases, the line resistance increases. Also, an increase in the wiring capacitance cannot be ignored. Furthermore, the hole capacitance at contact holes or via holes cannot be ignored in view of the multiplicity of wiring layers.

Therefore, the mere comparison between the maximum allowable load of a preceding logic macro-cell and an input capacitance load of a succeeding logic macro-cell ignores deteriorating effects of the wiring resistances, wiring capacitances and hole capacitances. Accordingly, this presents a problem in which a simulation result for a semiconductor integrated circuit does not correctly reflect an operation of an actual circuit.

In particular, for a semiconductor integrated circuit that is manufactured by a miniaturized process for a line width of 0.5 μm or less, the resistance value of MOS transistors in the logic macro-cell lowers, with the result that an output impedance of a preceding logic macro-cell 601 (see for example, FIG. 10). becomes small. On the other hand, the wiring resistance of connection nets 620–622 (see for example, FIG. 12) increases. This aggravates the problem described above.

Also, there is an occasion to design semiconductor integrated circuits that have substantially the same placement and wiring scheme, but have different driving conditions. In such a case, library data for each semiconductor integrated circuit that has minor changes needs to be prepared. As a result, a problem arises in that the volume of library data undesirably increases.

Therefore, it is an object of the present invention to provide a method and an apparatus that can perform the verification of a semiconductor integrated circuit with a higher accuracy.

It is another object of the present invention to provide, for a semiconductor integrated circuit in which a logic macro-cell that is subjected to the verification is connected to a plurality of logic macro-cells in succeeding stages, a verification method and a verification apparatus which can readily determine which one of connection nets is attributable to the generation of an error.

It is still another object of the present invention to provide a method and an apparatus that can perform the verification of semiconductor integrated circuits without increasing the volume of library data, when one semiconductor integrated circuit has driving conditions different than those of the other semiconductor integrated circuits.

DESCRIPTION OF TEE INVENTION

In accordance with one embodiment of the present invention, a verification method is provided for verifying a semiconductor integrated circuit having a first logic macro-cell to be verified and a second logic macro-cell in which an output from the first logic macro-cell is inputted. The method is characterized in comprising the step of obtaining data that quantitatively represents a blunting of a waveform of a signal that is inputted from the first logic macro-cell to the second logic macro-cell, and the step of converting the data that quantitatively represents a blunting of a waveform of a signal and data for the maximum allowable load that is predetermined for the first logic macro-cell into equivalent conversion values, and comparing the values and outputting a result of the comparison.

In accordance with the above-described embodiment, when the maximum allowable load of the first logic macro-cell is verified, data that quantitatively represents a blunting of a waveform of a signal that is inputted in the second logic macro-cell in a succeeding stage is obtained. Because this data cannot be directly compared with the data for the maximum allowable load of the first logic macro-cell, one or both of the data is converted to equivalent conversion values having their dimensions match one another, and the values are compared. Based on the comparison result, the maximum allowable load of the first logic macro-cell is verified.

In accordance with another embodiment of the present invention, the data that quantitatively represents a blunting of a waveform of a signal that is inputted in the second logic macro-cell is obtained as an input slew rate of a signal that is inputted in the second logic macro-cell from the first logic macro-cell. On the other hand, the maximum allowable load of the first logic macro-cell is set as a conversion slew rate representative of a slew rate of a signal. The conversion slew rate and the input slew rate are compared and a comparison result is outputted, to thereby verify the maximum allowable load of the first logic macro-cell.

In the step of outputting the comparison result, an error can be outputted when the input slew rate exceeds the conversion slew rate. In this case, the second logic macro-cell cannot be operated with its normal function.

In the step of outputting the comparison result, a value for the conversion slew rate and a value of the input slew rate may preferably be outputted together. In particular, when an error occurs, the cause of the error can be quantitatively verified.

The step of obtaining the input slew rate may preferably include the step of obtaining a wiring capacitance value and a wiring resistance value of a connection net that connects the first logic macro-cell and the second logic macro-cell, and the step of obtaining the input slew rate based on the wiring capacitance value and the wiring resistance value of the connection net.

As a result, the accuracy in the verification of the maximum allowable load of the first logic macro-cell is improved. This is important because, in the miniaturized process for processing sub-micron geometry, a blunting of a signal waveform due to the wiring resistance cannot be ignored.

In this case, the step of outputting the comparison result may preferably include the step of outputting the wiring resistance value and/or the wiring capacitance value of the connection net when an error is outputted.

In accordance with still another embodiment of the present invention, a verification method is defined for verifying a semiconductor integrated circuit that has a first logic macro-cell and a plurality of second logic macro-cells in which an output from the first logic macro-cell is inputted. In this case, an input slew rate of a signal inputted in each of the plurality of second logic macro-cells is obtained. A conversion slew rate and each of the input slew rates are compared, and comparison results are outputted, to thereby verify the maximum allowable load of the first logic macro-cell.

In this case, an error may preferably be outputted when at least one of the plurality of input slew rates exceeds the conversion slew rate. In this case, the second logic macro-cell that causes the error cannot be operated with its normal function.

In the step of outputting the comparison results, when errors are outputted, data that specifying all of the second logic macro-cells that cause the errors may also be outputted. As a result, the sources of the errors can be instantaneously determined.

Further, in the step of outputting the comparison results, when errors are outputted, a value for the conversion slew rate and values for the input slew rates of signals that are inputted in all of the second logic macro-cells that cause the errors may preferably be outputted together. Accordingly, the sources of the errors can be quantitatively verified.

The step of obtaining each of the input slew rates includes: the step of obtaining a wiring capacitance value and a wiring resistance value of each of a plurality of connection nets that connect the first logic macro-cell to the plurality of second logic macro-cells, and the step of obtaining each of the input slew rates that are inputted in the plurality of second logic macro-cells based on the wiring capacitance value and the wiring resistance value of each of the plurality of connection nets. As a result, the wiring resistance value that is a dominant factor attributable to the blunt of a signal waveform in the miniature processing for processing a sub-micron geometry is considered, and therefore the maximum allowable load of the first logic macro-cell can be verified with a higher accuracy.

In this case, the step of outputting the comparison results may preferably include the step of outputting wiring resistance values and/or wiring capacitance values of connection nets that connect to all of the second logic macro-cells that cause the errors, when the errors are outputted. By this, causes of the errors can be quantitatively confirmed.

In accordance with the embodiments described above, the step of setting the conversion slew rate may preferably include the step of changing the conversion slew rate that is predetermined for one driving condition based on another driving condition. This can prevent an increase in the amount of the library for the logic macro-cells, which may result from each of such modifications to the driving condition.

In accordance with another embodiment of the present invention, a verification method for verifying a semiconductor integrated circuit that has a first logic macro-cell and a plurality of second logic macro-cells in which an output from the first logic macro-cell is inputted through a plurality of connection nets. The verification method includes:

the step of setting a maximum allowable load of the first logic macro-cell, the step of obtaining a sum of input loads of the plurality of connection nets and the plurality of second logic macro-cells in which an output from the first logic macro-cell is inputted, and the step of comparing the maximum allowable load and the sum of input loads and outputting a comparison result, wherein the step of outputting the comparison result includes outputting an error when the sum of input loads exceeds the maximum allowable load, and outputting a value for the input load of each of the plurality of connection nets and the plurality of the second logic macro-cells.

In accordance with still another embodiment of the present invention, the maximum allowable load of the first logic macro-cell is verified depending on whether or not the sum of input loads of the plurality of connection nets and the plurality of second logic macro-cells exceeds the maximum allowable load of the first logic macro-cell. However, when the errors are outputted, a value for the input load of each of the plurality of connection nets and the plurality of the second logic macro-cells is also outputted. As a result, causes of the errors can be instantaneously recognized and the causes of the errors can be quantitatively recognized.

In accordance with still another embodiment of the present invention, the maximum allowable load of the first logic macro-cell is compared with a sum capacitance of a wiring capacitance of at least one of the connection nets and an input capacitance of at least one of the second logic macro-cells in which an output from the first logic macro-cell is inputted. When the sum capacitance exceeds the maximum allowable load, an error is outputted. In this instance, the wiring capacitance of the connection nets is considered, and therefore the verification accuracy is improved.

BRIEF DESCRIPTION OF THE DRAWINGS

FIG. 3A shows a diagram of another model that is different from the "π" model shown in FIG. 2.

FIG. 3B shows a diagram of a "π" model in accordance with another embodiment of the present invention.

FIG. 5 shows a block diagram of a verification apparatus in accordance with a first embodiment of the present invention that verifies the maximum allowable load of the logic macro-cell in a preceding stage in the circuit shown in FIG. 1.

FIG. 7 shows a block diagram of a verification apparatus in accordance with a second embodiment of the present invention.

FIG. 10 shows a block diagram of a verification apparatus in accordance with a third embodiment of the present invention.

BEST EMBODIMENTS OF THE PRESENT INVENTION

First Embodiment (Description of Circuit that Includes Verification Object)

Figure 1:
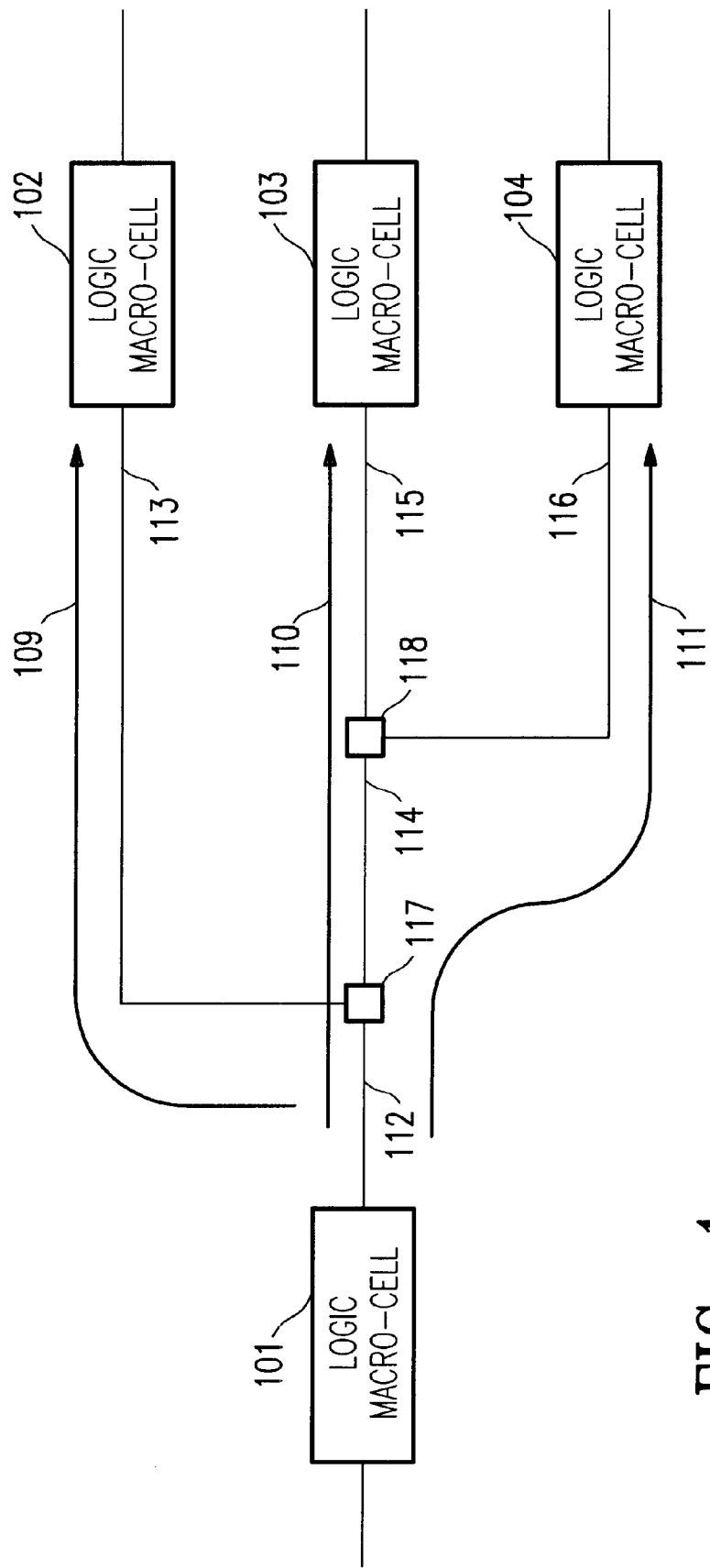
FIG. 1 shows a circuit diagram of a part of a circuit of a semiconductor integrated circuit that is subjected to verification in accordance with the present invention.

FIG. 1 shows a part of a circuit of a semiconductor integrated circuit to be verified. FIG. 1 shows a logic macro-cell in a preceding stage that is to be verified (first logic macro-cell) 101, wirings 112–116, holes 117, 118 and logic macro-cells in a succeeding stage (second logic macro-cell) 102–104. The present embodiment refers to an example in which the logic macro-cell 101 to be verified connects to the three logic macro-cells 102–104 in a succeeding stage. However, the logic macro-cells in the succeeding stage can be in any number greater than one.

Referring to FIG. 1, the logic macro-cell 101 and the logic macro-cell 102 are connected to one another through a connection net 109 that is composed of a first layer wiring 112, the hole 117 and a second layer wiring 113. The logic macro-cell 101 and the logic macro-cell 103 are connected to one another through a connection net 110 that is composed of the first layer wiring 112, the hole 117, a second layer wiring 114, the hole 118 and a first layer wiring 115. The logic macro-cell 101 and the logic macro-cell 104 are connected to one another through a connection net 111 that is composed of the first layer wiring 112, the. hole 117, the second layer wiring 114, the hole 118 and a first layer wiring 116.

(Description of Connection Net Modeling)

Figure 2:
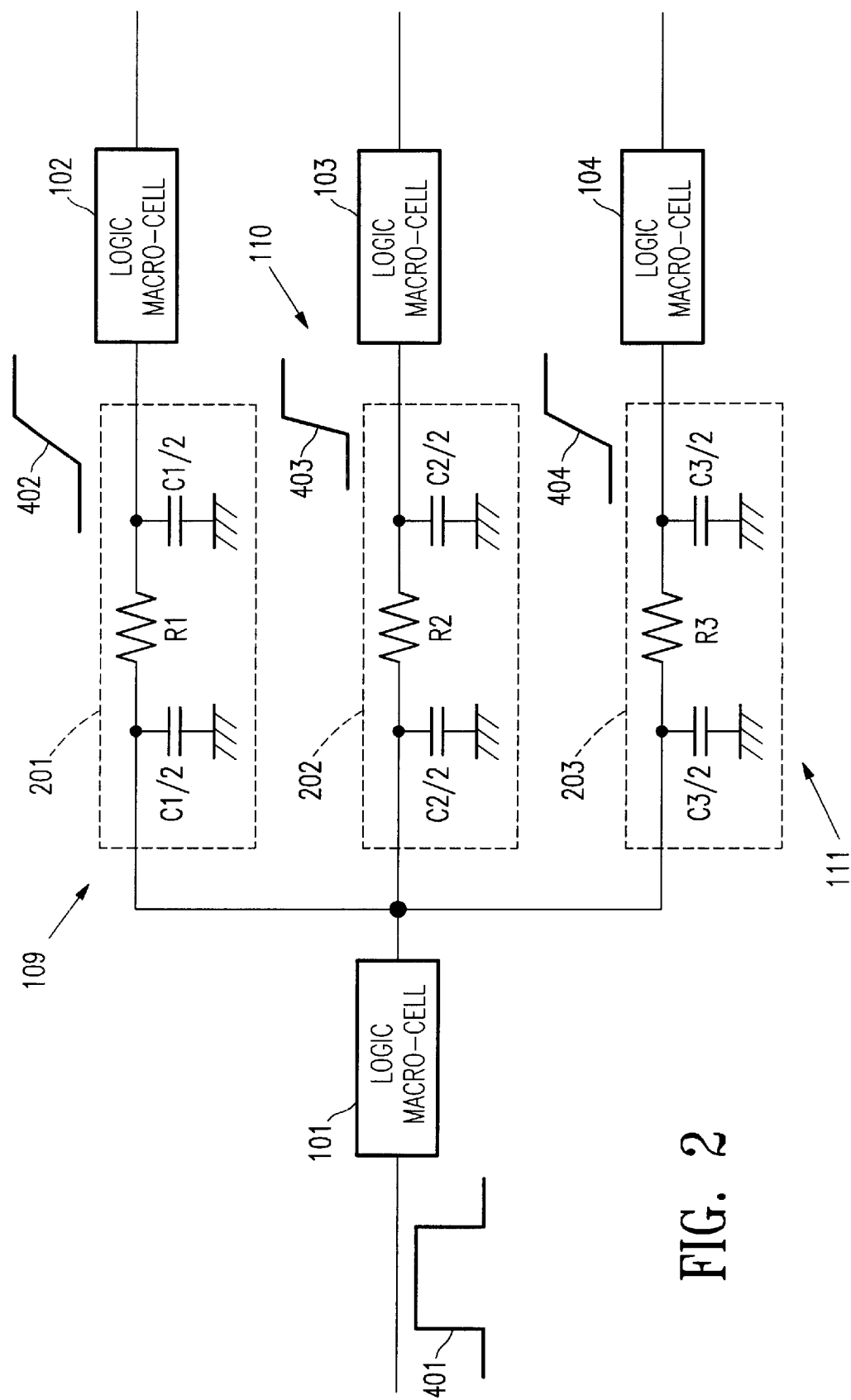
FIG. 2 shows a diagram of a circuit model illustrating a "π" model of wiring capacitances and wiring resistances of connection nets shown in FIG. 1.

FIG. 2 shows a circuit model in which the connection nets 109–111 shown in FIG. 1 are presented by "π" (pi) capacitance and resistance models. In other words, the connection net 109 includes a "π" capacitance and resistance model 201 having two capacitances C1/2 and a resistance R1 that are connected to one another in a π-shape. The connection net 110 includes a "π" capacitance and resistance model 202 having two capacitances C2/2 and a resistance R2 that are connected to one another in a π-shape. The connection net 111 includes a "π" capacitance and resistance model 203 having two capacitances C3/2 and a resistance R3 that are connected to one another in a π-shape.

The connection net 109 has a wiring capacitance and a wiring resistance, and therefore its wiring capacitance value C1 and wiring resistance value R1 define a capacitance value and a resistance value of the "π" capacitance and resistance model 201. In a similar manner, for the connection net 110, its wiring capacitance value C2 and wiring resistance value R2 define those for the "π" capacitance and resistance model 202; and for the connection net 111, its wiring capacitance value C3 and wiring resistance value R3 define those for the "π" capacitance and resistance model 203.

FIG. 2 also shows that, when a signal having a rectangular waveform 401 is inputted in the logic macro-cell 101, a blunting occurs in each of input signals 402–404 that are inputted in the logic macro-cells 102–104.

FIG. 2 shows the simplest configuration of a "π" capacitance and resistance model. As another example, a "π" model composed of, for example, four capacitances and three resistances can be adopted for each of the connection nets 109–111, as shown in FIG. 3A. As a result, the model becomes much closer to the actual wiring configuration shown in FIG. 1. FIG. 3B shows another example of a "π" capacitance and resistance model. The "π" capacitance and resistance model shown in FIG. 3B has four capacitances and three resistances for each of the connection nets 109–111. As shown in FIG. 3B, the four capacitances C1 in each of the connection nets may have different capacitance levels (e.g., 1/6:1/3:1/3:1/6) to provide an improved verification accuracy. Accordingly, the verification accuracy (which will be described below) becomes higher than that achieved by the model shown in FIG. 2, but it takes a longer calculation time than that required by the model shown in FIG. 2 because the "π" capacitance and resistance model is more complicated.

(Description of Verification Apparatus)

FIG. 5 shows a block diagram of a verification apparatus that quantitatively verifies the maximum allowable load of the logic macro-cell shown in FIG. 1 based on the "π" capacitance and resistance model shown in FIG. 2 or FIG. 3.

Referring to FIG. 5, a CPU 300 controls the verification apparatus and is connected to the following apparatuses. A first storage unit 301 stores data characteristic to a semiconductor integrated circuit that includes the logic macro-cells 101–104, such as placement and wiring results for the logic macro-cells 101–104 and the connection nets 109–111 shown in FIG. 1. For example, data provided by an automatic placement and wiring apparatus can be used as the placement and wiring results.

A second storage unit 302 stores a library that has been built up for designing semiconductor integrated circuits. The library contains data for all the logic macro-cells to be placed in a semiconductor integrated circuit that is to be designed. The data includes the maximum allowable loads and input capacitances (fan-in) and the like for all of the logic macro-cells. In addition, in accordance with the present embodiment, conversion slew rates, which are slew rates of signals that are converted from the maximum allowable loads of all of the logic macro-cells, may preferably be stored. Throughout this specification the term "slew rate" can refer to elapsed time during a rise or fall of a signal input into a macro-cell. For example, the term "slew rate" may be used to refer to "a rise time based on or associated with that slew rate".

A first operation unit 303 calculates the wiring capacitance values C1–C3 and the wiring resistance values R1–R3 of the connection nets 109–111. For example, the wiring capacitance C1 of the connection net 109 is obtained by calculating the following formula: C1=(capacitance value per each unit length)×(wiring length of the connection net 109) for each layer. The wiring resistance value R1 is obtained by calculating the following formula: R1=(sheet resistance value per unit length)×(wiring length of the connection net 109). The wiring capacitance values C2 and C3 and the wiring resistance values R2 and R3 can be obtained in a similar manner. The wiring length of each of the connection nets 109–111 is extracted from the placement and wiring results stored in the first storage section 301, using a circuit extraction program or the like. The number of the holes 117 and 118 shown in FIG. 1 that are included in each of the connection nets 109–111 is known from the placement and wiring results stored in the first storage unit 301. Accordingly, a resistance value obtained by calculating the following formula: (hole resistance value)×(the number of holes) may be included in the above-described wiring resistance value.

A second operation unit 304 calculates the magnitude of a blunting of each of the signals 402–404 that are inputted in the respective logic macro-cells 102–104 through the logic macro-cell 101 and the connection nets 109–111 based on the calculation result provided by the first operation unit 303 and the data stored in the second storage unit 302.

The second operation unit 304 includes, for example, a circuit simulator that calculates a blunting of a waveform of a signal that is provided by the "π" capacitance and resistance model shown in FIG. 2. For example, one product named Star-HSPICE manufactured by a U.S. company, AVANT, may be used as the circuit simulator of this type.

The wiring capacitance values C1–C3 and the wiring resistance values R1–R3 for the respective connection nets 109–111 that are obtained at the first operation unit 303 are inputted in the second operation unit 304 to set capacitance values and resistance values of the respective "π" capacitance and resistance models 201–203 shown in FIG. 2, for example.

RC delays at the logic macro-cell 101 and at each of the connection nets 109–111 are calculated such that the magnitude of a blunting of each input waveform that is calculated by the second operation unit 304 is numerically expressed and outputted as an input slew rate, for example.

Figure 4A:
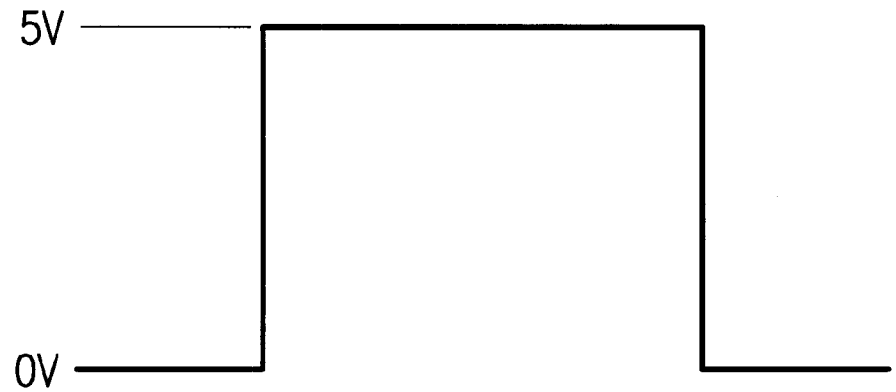
FIG. 4A shows a waveform of a rectangular wave that is inputted in a logic macro-cell in a preceding stage shown in FIG. 2.
Figure 4B:
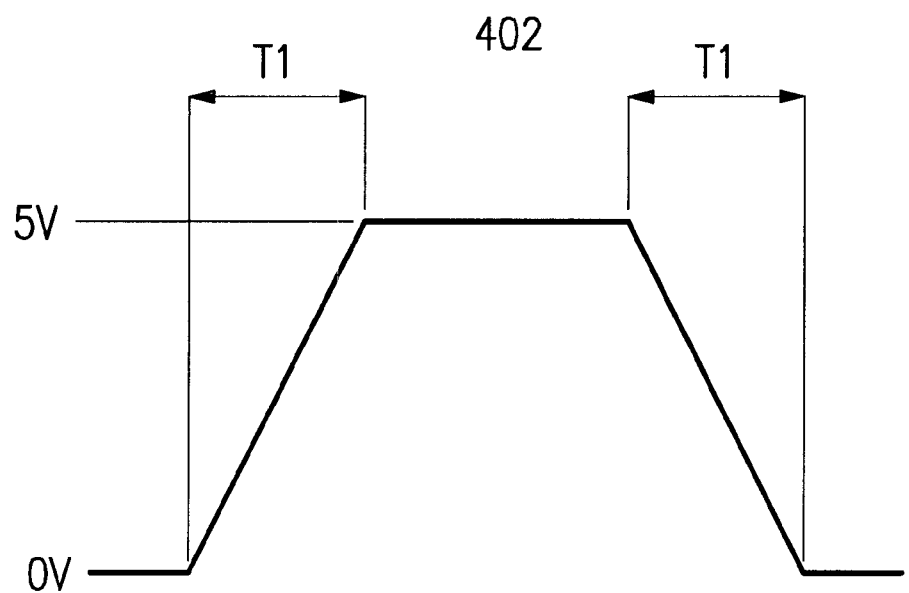
FIG. 4B shows a waveform that is used to describe an input slew rate of a signal that is inputted in logic macro-cells in a succeeding stage shown in FIG. 2.

A rectangular wave 401 shown in FIG. 4A is a signal that is inputted in the logic macro-cell 101 shown in FIG. 2 that is subjected to the verification. Let us consider the situation where the rectangular wave 401 is inputted through the logic macro-cell 101 and the connection net 109, and an input signal 402 is inputted in the logic macro-cell 102. The rectangular wave 401 is blunted as shown in FIG. 4B according to a time constant that is determined based on the wiring capacitance value and the wiring resistance value of the connection net 109. Time T1 shown in FIG. 4B is a time for which the waveform requires to rise or fall between 0V and 5V, and which becomes an input slew rate of the signal 402 that is inputted in the logic macro-cell 102. Similarly, an input slew rate T2 of a signal 403 that is inputted in the logic macro-cell 103, and an input slew rate T3 of a signal 404 that is inputted in the logic macro-cell 104 are obtained.

A comparator unit 305 shown in FIG. 5 compares the input slew rates T1, T2 and T3 for the logic macro-cells 102, 103 and 104 respectively with a conversion slew rate $T_{max}$ that is a slew rate of a signal obtained by converting the maximum allowable load for the logic macro-cell 101.

As described above, the conversion slew rate $T_{max}$ for the logic macro-cell 101 can be registered in the library stored in the second storage unit 302. Alternatively, the, maximum allowable load of the logic macro-cell 101 may be stored in the second storage unit 302, and a calculation may be performed to convert the maximum allowable load of the logic macro-cell 101 into a signal slew rate to thereby obtain a conversion slew rate $T_{max}$ for the logic macro-cell 101.

A display unit 307 displays comparison results provided by the comparator unit 305 and the like based on the control of a display control unit 306. In particular, the display unit 307 displays errors when any one of the input slew rates T1, T2 and T3 exceeds the conversion slew rate $T_{max}$. The display unit 307 displays calculation results provided by the first and the second operation units 303 and 304, or information provided by the first storage unit 301 depending on the requirements.

(Description of Verification Methods)

With reference to a flow chart shown in FIG. 6, a verification method will be described for verifying the maximum allowable load of the logic macro-cell 101 based on the "π" capacitance and resistance models 201–203 shown in FIG. 2, using the verification apparatus shown in FIG. 5.

The first operation unit 303 calculates the wiring capacitance values C1–C3 and the wiring resistance values R1–R3 used for the "π" capacitance and resistance models 201–203 shown in FIG. 2 (step 1). Data such as the wiring length of the connection nets 109–111 and the number of holes required for the calculation is given by the placement and wiring results stored in the first storage unit 301. Data such as a capacitance value and a resistance value per unit length may be provided by the first storage unit 301 as characteristic data that are characteristic to a given circuit, or may be set based on the library information stored in the second storage unit 302. Alternatively, the data may be inputted and set.

Next, the second operation unit 304 calculates the magnitude of a blunting (input slew rate) of a signal waveform that is inputted in each of the logic macro-cells 102–104 through the respective connection nets 109–111 (step 2).

The calculation is executed, for example, by using a circuit simulator that is built in the second operation unit 304. The circuit simulator calculates, based on the "π" capacitance and resistance models 201–203 shown in FIG. 2, how much the rectangular wave 401 shown in FIG. 4A is blunted. The blunting of each waveform is quantitatively provided as an input slew rate as shown in FIG. 4B. Input slew rates T1–T3 for the respective connection nets 109–111 are calculated. Alternatively, based on the wiring capacitance values C1–C3 and the wiring resistance values R1–R3 obtained by the first operation unit 303, they can be calculated from the following time constant equations: T1=C1×R1, T2=C2×R2 and T3=C3×R3.

Then, the comparator unit 305 compares each of the input slew rates T1–T3 for the connection nets calculated by the second operation unit 304 with the conversion slew rate $T_{max}$ of the logic macro-cell 101 provided from the second storage unit 302 (step 3). If the following relations:

$$T_{max} \geq T1, T_{max} \geq T2 \text{ and } T_{max} \geq T3 \quad (1)$$

are established (YES in step 4), the maximum allowable load of the logic macro-cell 101 is normal (step 5).

However, if any one of the following inequalities (2)–(4):

$$T_{max} < T1 \quad (2)$$

$$T_{max} < T2 \quad (3) \text{ and}$$

$$T_{max} < T3 \quad (4)$$

is established (NO in step 4), an error is displayed (step 6).

The display control unit 306 controls the display of the comparison results provided from the comparator unit 305 at the display unit 307. The error may be displayed in the following modes:

(A) An error is displayed when any one of the inequalities (2)–(4) is established.

(B) In addition to the display made in (A), information specifying any connection net, logic macro-cells in the output side, logic macro-cells in the input side and the like that cause the error is displayed. In this instance, any of the established inequalities (2)–(4) is displayed together with the values of $T_{max}$, and T1–T3.

(C) In addition to the display made in (A) and (B), the wiring capacitance value and/or the wiring resistance value obtained at the first operation unit 303, the wiring length provided from the first storage unit 301 and the like for the connection net that causes the error are displayed.

Among the above display modes, the display mode (A) enables an accurate determination of the error. This is because the wiring resistance values R1–R3 of the respective connection nets 109–111 are considered in the calculation of the input slew rates T1–T3 of the signals that are inputted in the respective logic macro-cells 102–104.

In the display by the display mode (B), in addition to the above, which one of the connection nets or the logic macro-cells that causes the error can be specified. Also, by displaying the established inequalities, the magnitude of the input slew rate that causes the error can be quantitatively recognized.

In the display by the display mode (C), in addition to the above, a quantitative recognition can be made as to which one of the wiring capacitances or the wiring resistances for the connection net that causes the error is dominant. As a result, a countermeasure against the error can be readily selected.

Second Embodiment

A second embodiment of the present invention will be described with reference to a block diagram shown in FIG. 7 and waveform diagrams shown in FIGS. 8A–9C.

A verification apparatus shown in FIG. 7 is different from the one shown in FIG. 5 in that a conversion slew rate $T_{max}$ that is read from the second storage unit 302 can be modified by a slew rate variable unit 311 based on information provided from an input unit 310.

Information that is inputted from the input unit 310 includes driving voltage and/or driving frequency. Therefore, the conversion slew rate $T_{max}$ that is read from the second storage unit 302 is modified based on the driving voltage and/or driving frequency. The reason for the conversion will be described below with reference to waveform diagrams shown in FIGS. 8A–9C.

Figure 8A:
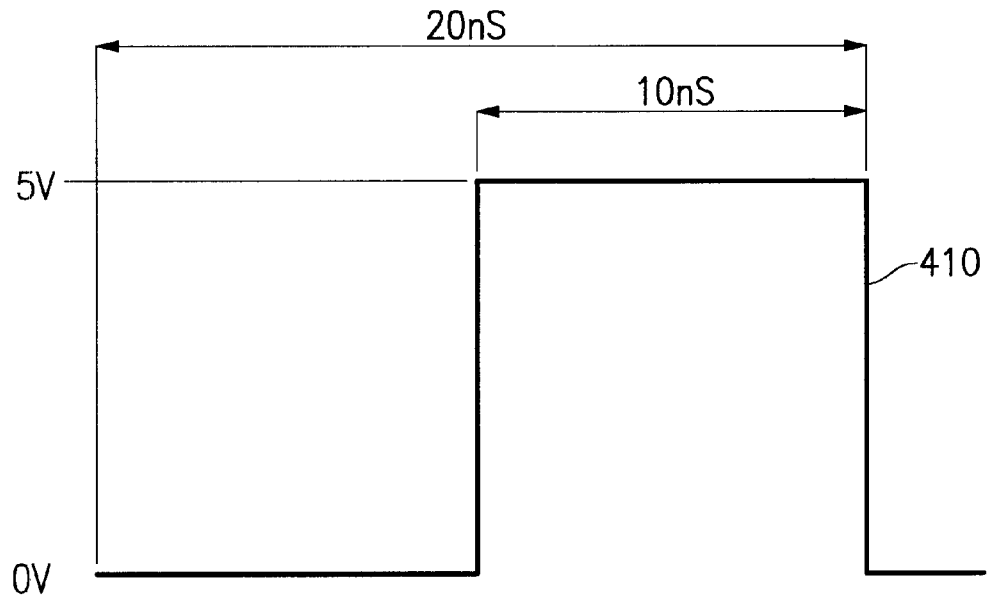
FIG. 8A shows a waveform of a rectangular wave having a driving frequency of 50 MHz and a driving voltage of 5V.
Figure 8B:
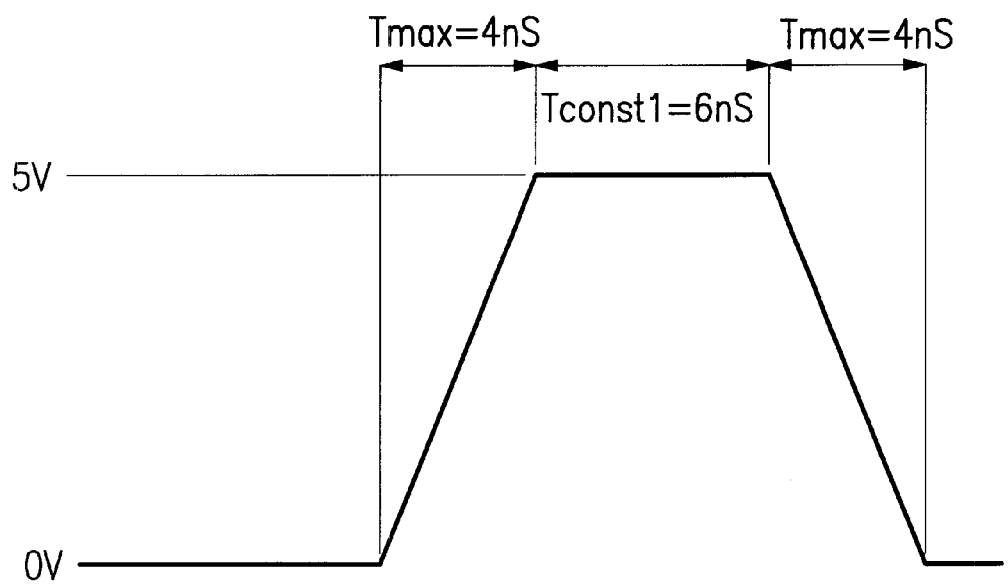
FIG. 8B shows a waveform of a conversion slew rate set at a driving frequency of 50 MHz and a driving voltage of 5V.

FIG. 8A shows a rectangular wave 410 at a driving frequency of 50 MHz and a driving voltage of 5V. FIG. 8B shows a conversion slew rate $T_{max}$ that is a slew rate of a signal converted from the maximum allowable load of the logic macro-cell 101. As shown in FIGS. 8A and 8B, one cycle of the rectangular wave 410 under the above-described driving condition is 20 nS. Let us assume that the conversion slew rate $T_{max}$ is 4 nS, for example. The conversion slew rate $T_{max}$ is associated with the data for the driving frequency of 50 MHz and the driving voltage of 5V, and stored in the second storage unit 302.

Figure 9A:
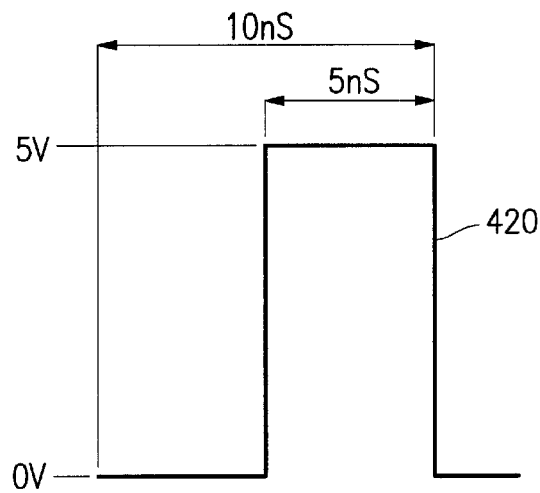
FIG. 9A shows a waveform of a rectangular wave having a driving frequency of 100 MHz and a driving voltage of 5V.

Let us assume that, in the driving condition for the circuit to be verified, the driving voltage of 5V is not changed, and the driving frequency is changed from 50 MHz to 100 MHz. In this instance, one cycle of the rectangular wave 420 is changed to 10 nS, as shown in FIG. 9A.

Figure 9B:
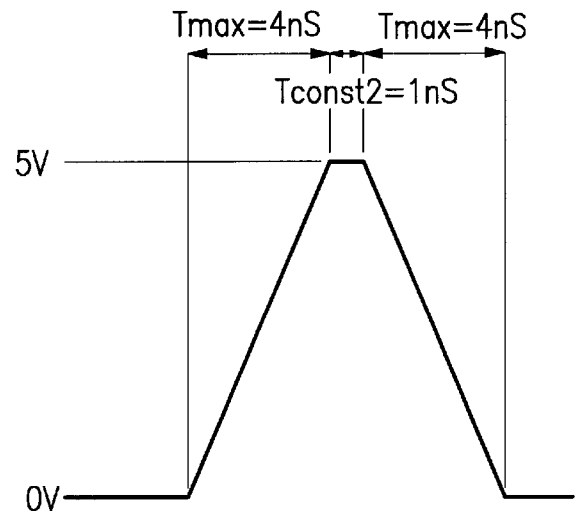
FIG. 9B shows a waveform of a conversion slew rate that is set equal to that shown in FIG. 8B, at a driving frequency of 100 MHz and a driving voltage of 5V.

If the conversion slew rate $T_{max}$ is not changed without regard to the change in the driving frequency, the time period $T_{const\ 2}$ during which the voltage is maintained at 5V becomes 1 nS, as shown in FIG. 9B. This is substantially shorter than the time period $T_{const\ 1} = 6$ nS, as shown in FIG. 8B. This means that the time period for which the potential exceeds the threshold value of the transistors that form the logic macro-cell 101 becomes substantially short, and this may result in malfunctions in the logic. Further, for example, when the driving frequency is set at a substantially high level, for example, at 200 MHz, the slew rate of a signal. has to be strictly set. Otherwise, the signal does not fully swing between, 0V and 5V due to the blunting of the signal, which results in malfunctions.

Accordingly, in accordance with the second embodiment, when a change in the condition for the driving frequency is inputted from the input unit 310, the slew rate variable unit 311 modifies the conversion slew rate $T_{max}$ that is read from the second storage unit 302.

Figure 9C:
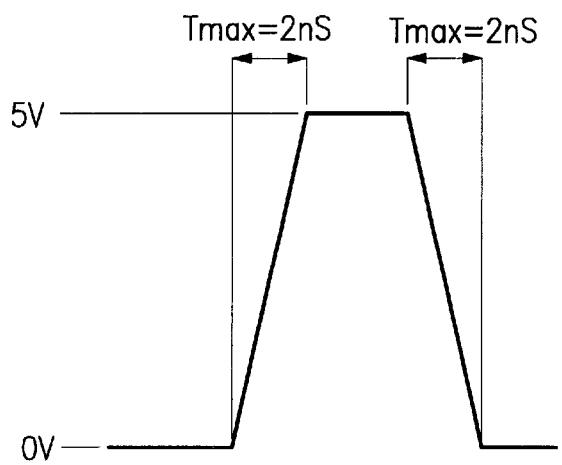
FIG. 9C shows a waveform of a conversion slew rate that is set lower than that shown in FIG. 8B, at a driving frequency of 100 MHz and a driving voltage of 5V.

Namely, when the driving frequency is changed through the use of the input unit 310 from 50 MHz to 100 MHz, for example, the slew rate variable unit 311 shortens the conversion slew rate $T_{max}$ from 4 nS to 2 nS, as shown in FIG. 9C.

In this manner, when the driving frequency becomes higher, the conversion slew rate $T_{max}$ is changed to a smaller value. On the other hand, when the driving frequency becomes lower, the conversion slew rate $T_{max}$ is changed to a greater value. The level of the changes can be externally set by the use of the input unit 310.

On the other hand, when the driving voltage is changed from 5V to 3V through the use of the input unit 310, and the driving frequency of 50 MHz is not changed in the driving condition for driving the circuit to be verified, the conversion slew rate $T_{max}$ is changed from 4 nS to 3 nS, for example. When the driving voltage is lowered, the performance of the circuit element lowers, and the signal speed becomes slower. Therefore, in order to obtain a speed that is equivalent to that achieved by 5V, a stricter fan-out control is required. In this respect, when the driving voltage is changed to a lower level, the conversion slew rate $T_{max}$ is also set to a lower level. On the other hand, when the driving frequency is not changed and the driving voltage is changed to a higher level, the conversion slew rate $T_{max}$ is also changed to a higher level.

In accordance with the present embodiment, the amount of the library stored in the second storage unit 302 does not need to be increased each time the driving condition is changed, as described above. As a result, an undesired increase in the amount of the library is prevented.

Third Embodiment

In accordance with a third embodiment of the present invention, a verification apparatus shown in FIG. 10 verifies a semiconductor integrated circuit having the circuit shown in FIG. 1.

Figure 11:
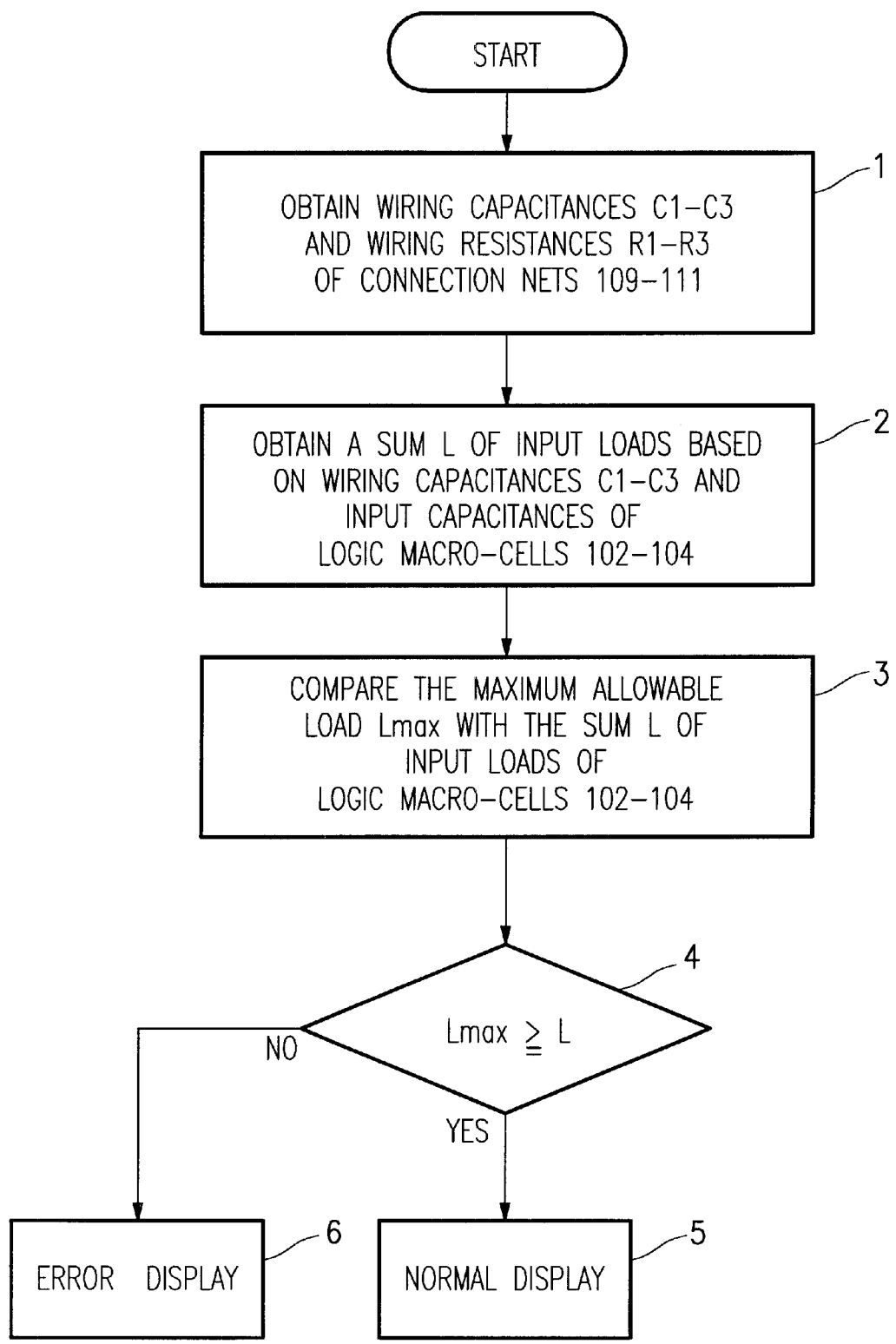
FIG. 11 shows a flow chart of a verification method conducted by the verification apparatus shown in FIG. 10.

In accordance with the third embodiment, the maximum allowable load $L_{max}$ of the logic macro-cell 101 is verified according to a flow chart shown in FIG. 11.

The verification apparatus shown in FIG. 10 has substantially the same structure as that of the verification apparatus shown in FIG. 7 except a part of its function. A verification method conducted by the verification apparatus shown in FIG. 10 will be described with reference to the flow chart shown in FIG. 11.

Figure 6:
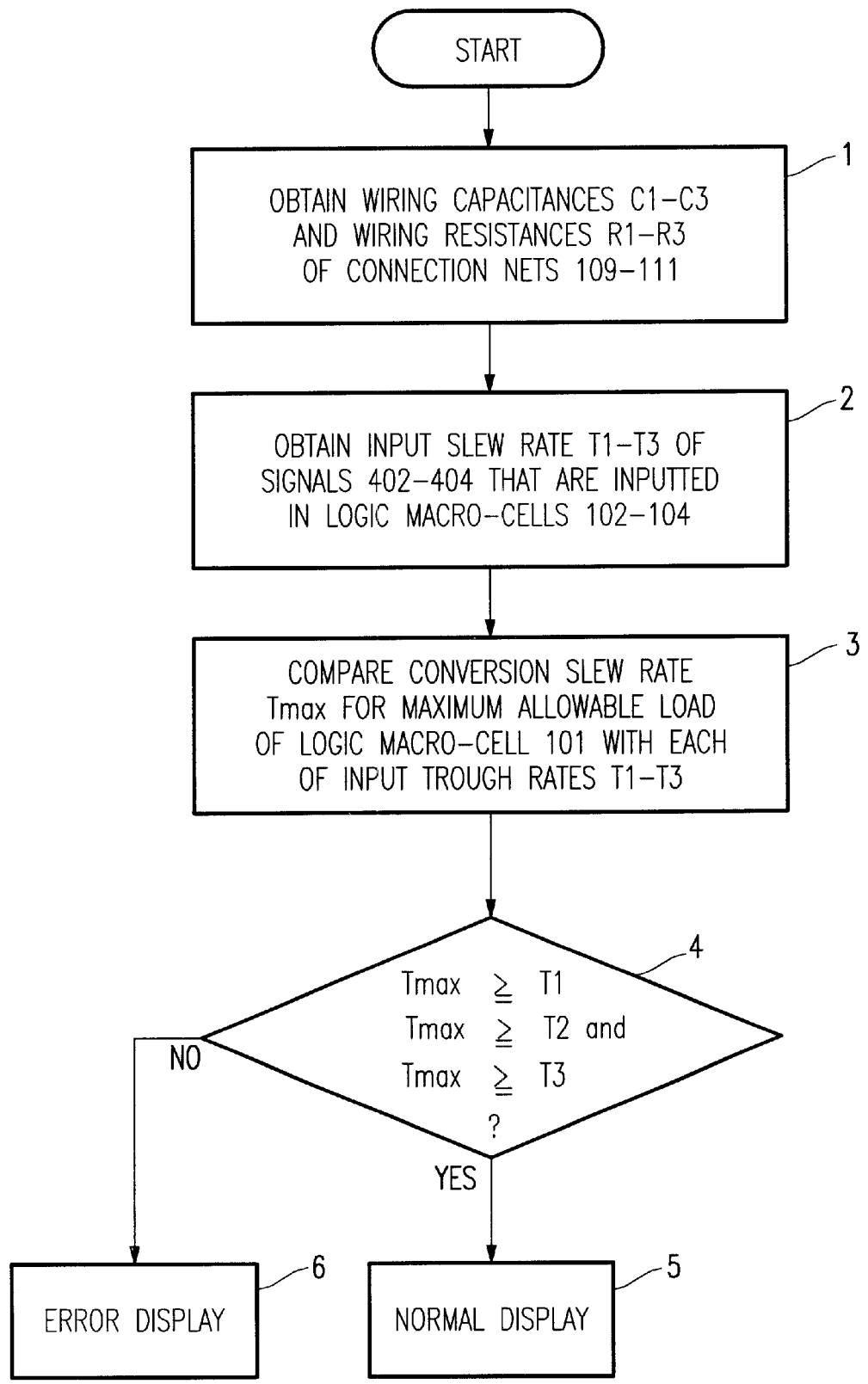
FIG. 6 shows a flow chart illustrating a verification method conducted by the verification apparatus shown in FIG. 5.

Step 1 shown in FIG. 11 is the same as step 1 shown in FIG. 6. In other words, under the control of a CPU 500, wiring capacitance values C1–C3 (that may include capacitance values of the holes) and wiring resistance values R1–R3 of the connection nets 109–111 shown in FIG. 2 are obtained by a first operation unit 503 based on information provided from a first storage unit 501. As will be discussed below, in the third embodiment, the calculation of the wiring resistance values R1–R3 is not necessarily indispensable. However, they can be calculated and displayed as reference information when an error is displayed.

Next, in step 2 of FIG. 11, a process different from the one in step 2 of FIG. 6 is performed. Namely, a second operation unit 504 calculates a sum L of input loads of the logic macro-cells 102–104 based on the wiring capacitance values C1–C3 of the respective connection nets 109–111 provided from the first operation unit 503 and input capacitance values Cin1, Cin2 and Cin3 of the respective logic macro-cells 102–104. It is noted that each of the input capacitance values Cin1, Cin2 and Cin3 of the respective logic macro-cells 102–104 is calculated based on the fan-in of each of the respective logic macro-cells 102–104 stored in the second storage unit 502. The sum L of input loads of the logic macro-cells 102–104 may be obtained by the following formula:

$$L = C1 + C2 + C3 + Cin1 + Cin2 + Cin3.$$

Then, a comparator unit 505 compares the sum L of input loads of the logic macro-cells 102–104 that is calculated by the second operation unit 504 with the maximum allowable load $L_{max}$ of the logic macro-cell 101 that is provided from the second storage unit 502 (step 3).

If the relation, $L_{max} \geq L \ldots$ (5), is established (YES in step 4), the maximum allowable load $L_{max}$ of the logic macro-cell 101 is normal (step 5).

However, if the inequality, $L_{max} < L \ldots$ (6), is established (NO in step 4), an error is displayed (step 6).

A display control unit 506 controls the display of the comparison results provided from the comparator unit 505 at a display unit 507. The error may be displayed in the following modes:

(A) An error is displayed when the inequality (6) is established.

(B) In addition to the display made in (A), the wiring capacitance values C1–C3 or the wiring resistance values R1–R3 obtained at the first operation unit 503, the wiring length provided from the first storage unit 501 or the like for the respective connection nets 109–111 are displayed.

Among the above display modes, the display mode (A) provides an indication of the error, but does not provide a source of the error. However, in the display by the display mode (B), which one of the connection nets and the logic macro-cells that causes the error can be quantitatively verified.

In addition to the above, in the display by the display mode (B), a quantitative recognition can be made as to which one of the wiring capacitances or the wiring resistances for the connection net that causes the error is dominant. As a result, a countermeasure against the error can be readily selected.

When the driving condition is changed by an input through the input unit 510 shown in FIG. 10, a load variable unit 511 changes the maximum allowable load $L_{max}$ provided from the second storage unit 502, in a similar manner as the second embodiment. In other words, when the driving frequency becomes higher, or when the driving voltage becomes lower, the maximum allowable load $L_{max}$ is changed to a lower value. On the other hand, when the driving frequency becomes lower, or when the driving voltage becomes higher, the maximum allowable load $L_{max}$ is changed to a higher value.

Fourth Embodiment

Figure 12:
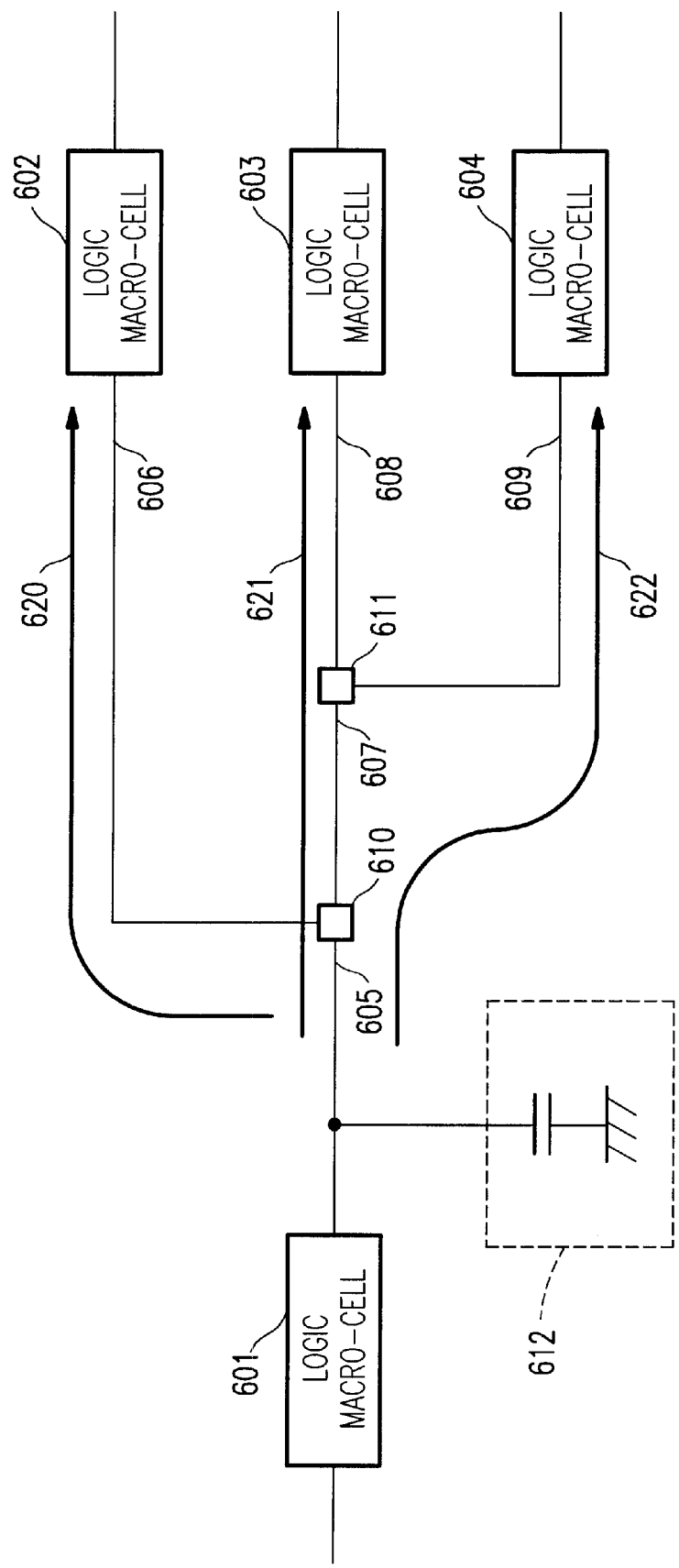
FIG. 12 shows a circuit diagram that is used to describe a verification method in accordance with a fourth embodiment of the present invention that verifies the maximum allowable load of a logic macro-cell with the use of a capacitance lumped-constant.

FIG. 12 shows a circuit model in accordance with a fourth embodiment of the present invention that verifies with a capacitance lumped-constant model whether or not the maximum allowable load of a logic macro-cell 601 in a preceding stage is acceptable. Referring to FIG. 12, the logic macro-cell 610 that is subjected to the verification is connected in its succeeding stage to three logic macro-cells 602–604, for example. The logic macro-cell 601 and the logic macro-cell 602 are connected to one another through a connection net 620 that is composed of a first layer wiring 605, a hole 610 and a second layer wiring 606. The logic macro-cell 601 and the logic macro-cell 603 are connected to one another through a connection net 621 that is composed of the first layer wiring 605, the hole 610, a second layer wiring 607, a hole 611 and a first layer wiring 608. The logic macro-cell 601 and the logic macro-cell 604 are connected to one another through a connection net 622 that is composed of the first layer wiring 605, the hole 610, the second layer wiring 607, the hole 611 and a first layer wiring 609.

To verify the maximum allowable load of the logic macro-cell 601 according to the circuit model shown in FIG. 12, the verification apparatus shown in FIG. 5 or FIG. 10 can be used.

In accordance with the fourth embodiment, a capacitance lumped-constant 612 shown in FIG. 12 needs to be obtained. The capacitance lumped-constant 612 can be obtained by calculating a sum capacitance value ($C_{out}$) that is connected to the succeeding stage of the logic macro-cell 601. The sum capacitance value ($C_{out}$) is a sum of wiring capacitance values of the connection nets 620–622, capacitance values of the holes 610 and 611, and input capacitance values of the respective logic macro-cells 602–604. The sum is calculated by the second operation unit 504, and each of the capacitance values is calculated by the first operation unit 503.

On the other hand, a maximum allowable load $C_{out\,max}$ of the logic macro-cell 601 is defined in advance in the library stored in the second storage unit 502. The comparator unit 505 compares the maximum allowable load $C_{out\,max}$ of the logic macro-cell 601 with the sum capacitance value $C_{out}$. If the maximum allowable load $C_{out\,max}$ of the logic macro-cell 601 is greater than the sum capacitance value $C_{out}$, the logic macro-cells 602–604 in the succeeding stage can be operated with a normal function. However, if the maximum allowable load $C_{out\,max}$ of the logic macro-cell 601 is smaller than the sum capacitance value $C_{out}$, the logic macro-cells 602–604 in the succeeding stage may not be operated with a normal function. In this case, an error is displayed.

In accordance with the fourth embodiment, unlike the third embodiment, information about the connection nets is not displayed when the error is displayed. However, since the sum capacitance value ($C_{out}$) includes the wiring capacitance values of the respective connection nets 620–622, and the capacitance values of the holes 610 and 611, the verification accuracy is improved.

The present invention is not limited to the embodiments described above, and a variety of modifications can be implemented within the scope of the subject matter of the present invention. The present invention is also effective in a structure in which a logic macro-cell 101 that is subjected to the verification is connected in its succeeding stage to one logic macro-cell through one connection net. In this case, the wiring resistance value of the connection net is considered, and therefore the maximum allowable load of the logic macro-cell can be accurately verified. When an error is displayed, the wiring resistance value and/or the wiring capacitance value of the connection net may also be displayed, such that a cause of the error can be readily specified.

What is claimed is:

1. A verification method for verifying a semiconductor integrated circuit having a first logic macro-cell to be verified and a second logic macro-cell in which an output from the first logic macro-cell is inputted, comprising:

obtaining data that quantitatively represents a time-delayed waveform of a signal that is provided by the first logic macro-cell and inputted in the second logic macro-cell;

converting the data that quantitatively represents the time-delayed waveform of a signal and data for the maximum allowable load that is predetermined for the first logic macro-cell into equivalent conversion values;

making a comparison between the values; and outputting a result of the comparison.

2. A verification method for verifying a semiconductor integrated circuit having a first logic macro-cell to be verified and a second logic macro-cell in which an output from the first logic macro-cell is inputted, comprising:

setting a conversion rise time that is based on a slew rate of a signal converted from a maximum allowable load of the first logic macro-cell;

obtaining an input rise time that is based on an input slew rate of a signal that is inputted from the first logic macro-cell to the second logic macro-cell; and comparing the conversion rise Time with the input rise time; and outputting a comparison result.

3. A verification method for verifying a semiconductor integrated circuit according to claim 2, wherein outputting the comparison result includes outputting an error when the input rise time that is based on an input slew rate exceeds the conversion rise time.

4. A verification method for verifying a semiconductor integrated circuit according to claim 3, wherein outputting the comparison result includes outputting a value for the conversion rise time and a value for the input rise time that is based on an input slew rate.

5. A verification method for verifying a semiconductor integrated circuit according to claim 2, wherein obtaining the input rise time that is based on an input slew rate includes;

obtaining a wiring capacitance value and a wiring resistance value of a connection net that connects the first logic macro-cell to the second logic macro-cell; and obtaining, the input rise time that is based on an input slew rate based on the wiring capacitance value and the wiring resistance value of the connection net.

6. A verification method for verifying a semiconductor integrated circuit according to claim 5, wherein outputting the comparison result includes outputting the wiring resistance value of the connection net, when the error is outputted.

7. A verification method for verifying a semiconductor integrated circuit according to claim 5, wherein outputting the comparison result includes outputting the wiring capacitance value of the connection net, when the error is outputted.

8. A verification method for verifying a semiconductor integrated circuit according to claim 2, wherein setting the conversion rise time includes changing a conversion rise time that is predetermined for one driving condition based on another driving condition.

9. A verification method for verifying a semiconductor integrated circuit having a first logic macro-cell to be verified and a plurality of second logic macro-cells in which an output from the first logic macro-cell is inputted, comprising:

setting a conversion rise time that is based on a slew rate of a signal converted from a maximum allowable load of the first logic macro-cell;

obtaining an input rise time that is based on an input slew rate of each of signals that are inputted from the first logic macro-cell to the plurality of second logic macro-cells; and comparing the conversion rise time with each of the input rise times that are based on input slew rates, and outputting comparison results.

10. A verification method for verifying a semiconductor integrated circuit according to claim 9, wherein outputting the comparison results includes outputting an error when at least one of the plurality of input rise times that is based on input slew rates exceeds the conversion rise time.

11. A verification method for verifying a semiconductor integrated circuit according to claim 10, wherein outputting the comparison results includes outputting information specifying any of the second logic macro-cells that cause the error, when the error is outputted.

12. A verification method for verifying a semiconductor integrated circuit according to claim 10, wherein outputting the comparison results includes outputting values for the conversion rise time and the input rise time that is based on an input slew rates of signals that are inputted in any of the second logic macro-cells that cause the error, when the error is outputted.

13. A verification method for verifying a semiconductor integrated circuit according to claim 9, wherein obtaining the input rise time than is based on an input slew rate includes:

obtaining a wiring capacitance value and a wiring resistance value of each of a plurality of connection nets that connect the first logic macro-cell to the plurality of second logic macro-cells; and obtaining the input rise time that is based on an input slew rate to be inputted in each of the plurality of logic macro-cells based on the wiring capacitance value and the wiring resistance value of each of the plurality of connection nets.

14. A verification method for verifying a semiconductor integrated circuit according to claim 13, wherein outputting the comparison results includes outputting the wiring resistance values of the connection nets that are connected to any of the second logic macro-cells that cause the error, when the error is outputted.

15. A verification method for verifying a semiconductor integrated circuit according to claim 13, wherein outputting the comparison results includes outputting the wiring capacitance values of the connection nets that are connected to any of the second logic macro-cells that cause the error, when the error is outputted.

16. A verification method for verifying a semiconductor integrated circuit according to claim 9, wherein setting the conversion slew rate includes changing a conversion rise time that is predetermined for one driving condition based on another driving condition.

17. A verification method for verification of a semiconductor integrated circuit that has a first logic macro-cell and a plurality of second logic macro-cells in which an input from the first logic macro-cell is inputted through a plurality of connection nets, comprising:

setting a maximum allowable load of the first logic macro-cell, obtaining a sum of input loads of the plurality of connection nets and the plurality of second logic macro-cells in which an output from the first logic macro-cell is inputted, and comparing the maximum allowable load and the sum of input loads and outputting a comparison result thereof, wherein outputting the comparison result includes outputting an error when the sum of input loads exceeds the maximum allowable load, and outputting a value for the input load of each of the plurality of connection nets and the plurality of the second logic macro-cells.

18. A verification method for verifying a semiconductor integrated circuit according to clam 17, wherein obtaining the sum of capacitances includes:

obtaining wiring capacitance values of the respective plurality of connection nets; and outputting the comparison results includes outputting the wiring capacitance values of the respective plurality of connection nets, when the error is outputted.

19. A verification method for verifying a semiconductor integrated circuit according to claim 17, further comprising:

obtaining wiring resistance values of the respective plurality of connection nets, and wherein outputting, the comparison results includes outputting the wiring resistance values of the respective plurality of connection nets, when the error is outputted.

20. A verification method for verifying a semiconductor integrated circuit according to claim 17, wherein setting the maximum allowable load includes changing a maximum allowable load that is predetermined for one driving condition based on another driving condition.

21. A verification method for verification of a semiconductor integrated circuit that has a first logic macro-cell and at least one second logic macro-cell in which an output from the first logic macro-cell is inputted through at least one connection net, comprising:

setting a maximum allowable load of the first logic macro-cell;

obtaining a sum capacitance of a wiring capacitance of the at least one connection net and an input capacitance of the at least one second logic macro-cell in which an output from the first logic macro-cell is inputted; and comparing the maximum allowable load and the sum capacitance and outputting a comparison result thereof, wherein outputting the comparison result includes outputting an error when the sum capacitance exceeds the maximum allowable load.

22. A verification apparatus for verifying a semiconductor integrated circuit having a first logic macro-cell to be verified and a second logic macro-cell in which an output from the first logic macro-cell is inputted, comprising:

a setting device that sets a conversion rise time that is based on a slew rate of a signal converted from a maximum allowable load of the first logic macro-cell;

an operation device that calculates an input rise time that is based on an input slew rate of a signal That is inputted from the first logic macro-cell to the second logic macro-cell; and an outputting device that compares the conversion rise time with the input rise time, and outputs a comparison result.

23. A verification apparatus for verifying a semiconductor integrated circuit having a first logic macro-cell to be verified and a plurality of second logic macro-cells in which an output from the first logic macro-cell is inputted, comprising:

a setting device that sets a conversion rise time that is based on a slew rate of a signal converted from a maximum allowable load of the first logic macro-cell;

an operation device that calculates an input rise time that is based on an input slew rate of each of signals that are inputted from the first logic macro-cell to the plurality of second logic macro-cells; and an outputting device that compares the conversion rise time with each of the input rise times that are based on an input slew rates, and outputs comparison results.

24. A verification apparatus according to claim 22, wherein the setting device comprises:

a storage unit for storing a predetermined conversion rise time for one driving condition;

an input unit for inputting another diving condition different than the one driving condition; and a slew rate variable unit that changes the conversion rise time provided from the storage unit based on data inputted from the input unit.

25. A verification apparatus for verification of a semiconductor integrated circuit that bas a first logic macro-cell and a plurality of second logic macro-cells in which an input from the first logic macro-cell is inputted through a plurality of connection nets, comprising:

a setting device that sets a maximum allowable load of the first logic macro-cell;

an operation device that calculates a sum of input loads of the plurality of connection nets and the plurality of second logic macro-cells in which an output from the first logic macro-cell is inputted; and an output device that compares the maximum allowable load and the sum of input loads and outputs a comparison result thereof, wherein the output device outputs an error when the sum of input loads exceeds the maximum allowable load, and outputs a capacitance value of each of the plurality of connection nets and the plurality of second logic macro-cells.

26. A verification apparatus according to claim 25, the setting device comprising:

a storage unit for storing a predetermined maximum allowable load of the fist logic mayo-cell for one driving condition;

an input unit for inputting another driving condition different Man the one driving condition; and a load variable unit that changes the maximum allowable load provided from the storage unit based on data inputted from the input unit.

27. A verification apparatus for verification of a semiconductor integrated circuit that has a first logic macro-cell and at least one second logic macro-cell in which an input from the first logic macro-cell is inputted through at least one connection net, comprising:

a setting device that sets a maximum allowable load of the first logic macro-cell;

an operation device that obtains a sum capacitance of a wiring capacitance of the at least one connection net and an input capacitance of the at least one second logic macro-cell in which an output from the first logic macro-cell is inputted, and an output device that compares the maximum allowable load and the sum capacitance and outputs a comparison result thereof, wherein the output device outputs an error when the sum capacitance exceeds the maximum allowable load.

28. A verification apparatus adapted to verify a semiconductor integrated circuit having a first logic macro-sell to be verified and a second logic macro-cell in which an output from the first logic macro-cell is inputted, comprising, means for obtaining data that quantitatively represents a time-delayed waveform of a signal that is provided by the first logic macro-cell and inputted in the second logic macro-cell; and means for converting the data that quantitatively represents the time-delayed waveform of a signal and data for the maximum allowable load that is predetermined for the first logic macro-cell into equivalent conversion values, making a comparison between the values and outputting a result of the comparison.

29. A verification apparatus adapted to verify a semiconductor integrated circuit having a first logic macro-cell to be verified and a second logic macro-cell in which an output from the fist logic macro-cell is inputted, comprising:

means for setting a conversion rise rime that is based on a slew rate of a signal converted from a maximum allowable load of the first logic macro-cell;

means for obtaining an input rise time that is based on an input slew rate of a signal that is inputted from the first logic macro-cell to the second logic macro-cell;

means for comparing the conversion rise time with the input rise time; and means for outputting a comparison result.

30. A verification apparatus according to claim 29, wherein means for outputting the comparison result includes outputting an error when the input rise time that is based on an input slew rate exceeds the conversion rise time.

31. A verification apparatus according to claim 30, wherein means for outputting the comparison result includes outputting a value for the conversion rise time and a value for the input rise time that is based on an input slew rate.

32. A verification apparatus according to claim 29, wherein means for obtaining the input rise time that is based on an input slew rate includes:

means for obtaining a wiring capacitance value and a wiring resistance value of a connection net that connects the first logic macro-cell to the second logic macro-cell; and means for obtaining the input rise time that is based on an input slew rate based on the wiring capacitance value and the wiring resistance value of the connection net.

33. A verification apparatus according to claim 32, wherein means for outputting the comparison result includes means for outputting the wiring resistance value of the connection net, when the error is outputted.

34. A verification apparatus according to claim 32, wherein means for outputting the comparison result includes means for outputting the wiring capacitance value of the connection net, when the error is outputted.

35. A verification apparatus according to claim 29, wherein means for setting the conversion rise time includes means for changing a conversion rise time that is predetermined for one driving condition based on another driving condition.

36. A verification apparatus having a first logic macro-cell to be verified and a plurality of second logic macro-cells in which an output from the first logic macro-cell is inputted, comprising:

means for setting a conversion rise time that is based on a slew rate of a signal converted from a maximum allowable load of the first logic macro-cell;

means for obtaining an input rise time that is based on an input slew rate of each of signals that are inputted from the first logic macro-cell to the plurality of second logic macro-cells;

means for comparing the conversion rise time with each of the input rise times that are based on input slew rates; and means for outputting comparison results.

37. A verification apparatus according to claim 36, wherein means for outputting the comparison results includes:

means for outputting an error when at least one of the plurality of input rise times that is based on input slew rates exceeds the conversion rise time.

38. A verification apparatus according to claim 37, wherein means for outputting the comparison results includes:

means for outputting information specifying any of the second logic macro-cells that cause the error, when the error is outputted.

39. A verification apparatus according to claim 37, wherein means for outputting the comparison results includes:

means for outputting values for the conversion rise time and the input rise time that is based on an input slew rates of signals that are inputted in any of the second logic macro-cells that cause the error, when the error is outputted.

40. A verification apparatus according to claim 36, wherein means for obtaining the input rise time that is based on an input slew rate includes:

means for obtaining a wiring capacitance value and a wiring resistance value of each of a plurality of connection nets that connect the first logic macro-cell to the plurality of second logic macro-cells; and means for obtaining the input rise time that is based on an input slew rate to be inputted in each of the plurality of logic macro-cells based on the wiring capacitance value and the wiring, resistance value of each of the plurality of connection nets.

41. A verification apparatus according to claim 40, wherein means for outputting the comparison results includes:

means for outputting the wiring resistance values of the connection nets that are connected to any of the second logic macro-cells that cause the error, when the error is outputted.

42. A verification apparatus according to claim 40, wherein means for outputting the comparison results includes:
means for outputting the wiring capacitance values of the connection nets that are connected to any of the second logic macro-cells that cause the error, when the error is outputted.

43. A verification apparatus according to claim 36, wherein means for setting the conversion slew rate includes:
means for changing a conversion rise time that is predetermined for one driving condition based on another driving condition.

44. A verification apparatus adapted to verify a semiconductor integrated circuit that has a first logic macro-cell and a plurality of second logic macro-cells in which an input from the first logic macro-cell is inputted through a plurality of connection nets, comprising:
means for setting a maximum allowable load of the fist logic macro-cell;
means for obtaining a sum of input loads of the plurality of connection nets and the plurality of second logic macro-cells in which an output from the first logic macro-cell is inputted;
means for comparing the maximum allowable load and the sum of input loads; and
means for outputting a comparison result thereof,
wherein means for outputting the comparison result includes means for outputting an error when the sum of input loads exceeds the maximum allowable load, and means for outputting a value for the input load of each of the plurality of connection nets and the plurality of the second logic macro-cells.

45. A verification apparatus according to claim 44, wherein means for obtaining the sum of capacitances includes:
means for obtaining wiring capacitance values of the respective plurality of connection nets; and
means for outputting the comparison results includes outputting the wiring capacitance values of the respective plurality of connection nets, when the error is outputted.

46. A verification apparatus according to claim 44, further comprising:
means for obtaining wiring resistance values of the respective plurality of connection nets, and wherein means for outputting the comparison results includes outputting the wiring resistance values of the respective plurality of connection nets, when the error is outputted.

47. A verification apparatus according to claim 44, wherein means for setting the maximum allowable load includes means for changing a maximum allowable load that is predetermined for one driving condition based on another driving condition.

48. A verification apparatus adapted to verify a semiconductor integrated circuit that has a first logic macro-cell and at least one second logic macro-cell in which an output from the first logic macro-cell is inputted through at least one connection net, comprising:
means for setting a maximum allowable load of the first logic macro-cell;
means for obtaining a sum capacitance of a wiring capacitance of the at least one connection net and an input capacitance of the at least one second logic macro-cell in which an output from The first logic macro-cell is inputted; and
means for comparing the maximum allowable load and the sum capacitance and outputting a comparison result thereof,
wherein means for outputting the comparison result outputs an error when the sum capacitance exceeds the maximum allowable load.

49. A verification method for verifying a semiconductor integrated circuit having a first logic macro-cell to be verified and a second logic macro-cell in which an output from the first logic macro-cell is inputted, comprising:
setting a conversion rise time based on a signal converted from a maximum allowable load of the first logic macro-cell;
obtaining an input rise time that is based on a signal that is inputted from the first logic macro-cell to the second logic macro-cell; and
comparing the conversion rise time with the input rise time; and
outputting a comparison result.

50. A verification method for verifying a semiconductor integrated circuit according to claim 49, wherein outputting the comparison result includes outputting an error when the input rise the exceeds the conversion rise time.

51. A verification method for verifying a semiconductor integrated circuit according to claim 50, wherein outputting the comparison result includes outputting a value for the conversion rise time and a value for the input rise time.

52. A verification method for verifying a semiconductor integrated circuit according to claim 49, wherein obtaining the input rise time includes:
obtaining a wiring capacitance value and a wiring resistance value of a connection net that connects the first logic macro-cell to the second logic macro-cell; and
obtaining the input rise time based on the wiring capacitance value and the wiring resistance value of the connection net.

53. A verification method for verifying a semiconductor integrated circuit according to claim 52, wherein outputting the comparison result includes outputting the wiring resistance value of the connection net, when the error is outputted.

54. A verification method for verifying a semiconductor integrated circuit according to claim 52, wherein outputting the comparison result includes outputting the wiring capacitance value of the connection net, when the error is outputted.

55. A verification method for verifying a semiconductor integrated circuit according to claim 54, wherein setting the conversion rise time includes changing a conversion rise time that is predetermined for one driving condition based on another driving condition.

56. A verification method for verifying a semiconductor integrated circuit having a first logic macro-cell to be verified and a plurality of second logic macro-cells in which an output from the first logic macro-cell is inputted, comprising:
setting a conversion rise time based on a signal converted from a maximum allowable load of the first logic macro-cell;
obtaining an input rise time based on each of signals tat are inputted from the first logic macro-cell to the plurality of second logic macro-cells;
comparing the conversion rise time with each of the input rise times; and outputting
comparison results.

57. A verification method for verifying a semiconductor integrated circuit according to claim 56, wherein outputting the comparison results includes outputting an error when at least one of the plurality of input rise times exceeds the conversion rise time.

58. A verification method for verifying a semiconductor integrated circuit according to claim 57, wherein outputting the comparison results includes outputting information specifying any of the second logic macro-cells that cause the error, when the error is outputted.

59. A verification method for verifying a semiconductor integrated circuit according to claim 58, wherein outputting the comparison results includes outputting values for the conversion rise time and the input rise time based on signals that are inputted in any of the second logic macro-cells that cause the error, when the error is outputted.

60. A verification method for verifying a semiconductor integrated circuit according to claim 56, wherein obtaining the input rise time includes:

obtaining a wiring capacitance value and a wiring resistance value of each of a plurality of connection nets that connect the first logic macro-cell to the plurality of second logic macro-cells; and obtaining the input rise time based on an input to each of the plurality of logic, macro-cells based on the wiring capacitance value and the wiring resistance value of each of the plurality of connection nets.

61. A verification method for verifying a semiconductor integrated circuit according to claim 60, wherein outputting the comparison results includes outputting the wiring resistance values of the connection nets that are connected to any of the second logic macro-cells that cause the error, when the error is outputted.

62. A verification method for verifying a semiconductor integrated circuit according to claim 60, wherein outputting the comparison results includes outputs the wiring capacitance values of the connection nets that are connected to any of the second logic macro-cells that cause the error, when the error is outputted.

63. A verification method for verifying a semiconductor integrated circuit according to claim 56, wherein setting the conversion slew rate includes changing a conversion rise time that is predetermined for one driving condition based on another diving condition.

64. A verification apparatus for verifying a semiconductor integrated circuit having a first logic macro-cell to be verified and a second logic macro-cell in which an output from the first logic macro-cell is inputted, comprising:

a setting device that sets a conversion rise time based on a signal converted from a maximum allowable load of the first logic macro-cell;

an operation device that calculates an input rise time based on a signal that is inputted from the first logic macro-cell to the second logic macro-cell; and an outputting device that compares the conversion rise time with the input rise time, and outputs a comparison result.

65. A verification apparatus for verifying a semiconductor integrated circuit having a first logic macro-cell to be verified and a plurality of second logic macro-cells in which an output from the first logic macro-cell is inputted, comprising:

a setting device that sets a conversion rise time based on a signal converted from a maximum allowable load of the first logic macro-cell;

an operation device that calculates an input rise time based on each of signals that are inputted from the first logic macro-cell to the plurality of second logic macro-cells; and an outputting device that compares the conversion rise time with each of the input rise times, and outputs comparison results.

* * * * *